(12) United States Patent
Bain (10) Patent No.: US 7,840,880 B1
(45) Date of Patent: Nov. 23, 2010

(54) METHODS AND APPARATUS FOR ERROR CHECKING CODE COMPUTATION

(75) Inventor: Peter Bain, Ottawa (CA)

(73) Assignee: Altera Corporation, San Jose, CA (US)

( * ) Notice: Subject to any disclaimer, the term of this patent is extended or adjusted under 35 U.S.C. 154(b) by 1057 days.

(21) Appl. No.: 11/527,197

(22) Filed: Sep. 25, 2006

(51) Int. Cl.
*H03M 13/03* (2006.01)

(52) U.S. Cl. .................. 714/781; 714/758; 714/776; 714/807

(58) Field of Classification Search ................ 714/781, 714/758, 776, 807
See application file for complete search history.

(56) References Cited

U.S. PATENT DOCUMENTS

| | | | | |
|---|---|---|---|---|
| 3,798,597 A | * | 3/1974 | Frambs et al. | 714/781 |
| 5,428,629 A | * | 6/1995 | Gutman et al. | 714/758 |
| 6,240,540 B1 | * | 5/2001 | Jones et al. | 714/807 |
| 6,519,738 B1 | * | 2/2003 | Derby | 714/781 |
| 6,594,793 B1 | * | 7/2003 | Guey | 714/776 |
| 2005/0018705 A1 | * | 1/2005 | Ohsuge | 370/441 |

OTHER PUBLICATIONS

Shieh et al., "A Systematic Approach for Parallell CRC Computations", Journal of Information Science and Engineerings, 17, 445-461 (2001).

* cited by examiner

*Primary Examiner*—Fritz Alphonse
(74) *Attorney, Agent, or Firm*—Weaver Austin Villeneuve & Sampson LLP (57) ABSTRACT

Methods and apparatus are provided for more efficiently computing error checking codes such as cyclic redundancy checks (CRCs). Based on particular characteristics of CRCs, an input sequence is intelligently divided into a series of subsequences. Each subsequence gets selected bits from the input sequence. The error checking code is calculated on each subsequence. The results are bit-interleaved and an error checking code is calculated over this interleaved result to obtain the error checking code over the entire sequence.

25 Claims, 6 Drawing Sheets

METHODS AND APPARATUS FOR ERROR CHECKING CODE COMPUTATION

BACKGROUND OF THE INVENTION

1. Field of the Invention

The present invention relates to error checking codes. More specifically, the techniques of the present invention provide mechanisms for efficiently computing error checking codes such as cyclic redundancy checks (CRCs).

2. Description of Related Art

Error checking codes such as cyclic redundancy checks (CRCs) are used in many communication and storage applications to detect data corruption. In a typical example, a message (M) is divided by a polynomial (P) known to both a sender and a receiver. The remainder (R) is transmitted with the message (M) to the receiver. The receiver uses the remainder (R) to verify that the message (M) has not been corrupted. R is referred to also as the Frame Check Sequence (FCS) or as a CRC. Although it is possible that different messages can give the same remainder R when divided by a polynomial (P), CRC computations have been highly effective, as the probability that corrupted data can pass a 32 bit CRC (CRC32) check is remote.

Galois field division is often used to determine R. Galois field division is implemented using shift registers and exclusive-OR (XOR) gates. In a simplified example, division can be performed by performing one XOR, bit shifting, performing another XOR, bit shifting, etc. However, computation of CRCs remains resource intensive. Wide bit width CRC require a large amount of logic or circuitry for computation. Some mechanisms allow parallel computation of CRCs. However, available mechanisms treat the entire CRC as a single unit and still require many levels of logic.

Performing CRCs computations can be inefficient on a variety of devices. That is, performing these computations may require many levels of logic or require a large amount of resources. Consequently, the techniques of the present invention provide improved mechanisms for computing error checking codes such as CRCs.

SUMMARY OF THE INVENTION

Methods and apparatus are provided for more efficiently computing error checking codes such as cyclic redundancy checks (CRCs). Based on particular characteristics of CRCs, an input sequence is intelligently divided into a series of subsequences. Each subsequence gets selected bits from the input sequence. The error checking code is calculated on each subsequence. The results are bit-interleaved and an error checking code is calculated over this interleaved result to obtain the error checking code over the entire sequence.

In one embodiment, a technique for computation of a cyclic redundancy check (CRC) is provided. A data sequence P having a length of N bits is received. The data sequence P is split into M subsequences. The M subsequences are provided to multiple separate CRC circuits. The multiple separate CRC circuits generate a multiple sub-CRCs. The multiple sub-CRCs are bit interleaved to provide a bit-interleaved sub-CRC. A CRC calculation is performed over the bit-interleaved sub-CRC at CRC combiner circuitry. The CRC combiner circuitry provides the CRC of the data sequence P.

In another embodiment, a device for computation of a cyclic redundancy check (CRC) is provided. The device includes a data input sequence block, multiple CRC circuits, a bit interleaver, and a CRC combiner. The data input sequence block is operable to receive a data sequence P having a length of N bits. The multiple CRC circuits are operable to process M subsequences split from the data sequence P to generate multiple sub-CRCs. A bit interleaver is operable to combine the multiple sub-CRCs to provide a bit-interleaved sub-CRC. A CRC combiner is operable to perform a CRC calculation over the bit-interleaved sub-CRC. The CRC combiner provides the CRC of the data sequence P.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of cyclic redundancy checks or cyclic redundancy codes. However, it should be noted that the techniques of the present invention can be applied to a variety of different error checking and error correcting codes and mechanisms. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

Cyclic redundancy checks are used in many networking and data storage applications to detect transmission errors and data corruption. In a simplified implementation, a data stream or message (M) is divided by a polynomial (P) known to both a sender and a receiver. The remainder (R) is stored and/or transmitted with the message to allow later verification that M was not corrupted. R is also referred to as a Frame Check Sequence (FCS) or a CRC. To allow efficient division of M by R, Galois field division is used. Galois field division is implemented using shift registers and Exclusive-OR (XOR) gates in a variety of hardware devices. Division can be performed by performing an XOR, bit shifting, performing another XOR, bit shifting, etc. To increase efficiency, it is well recognized that the bits in R or in a CRC can be calculated by performing XOR computations of various data and polynomial bits simultaneously.

In one example, a divisor is three bits (e.g. 101) and a dividend is six bits (e.g. 111001). In simplified polynomial long division, it is determined at each stage of division whether the leading bit of the current three bits is 0 or 1. If it is 0, a 0 is placed in the quotient and an XOR operation is performed with the current bits and 000. If the leading bit of the current three bits is 1, a 1 is placed in the quotient and an XOR is performed with the current bits and the divisor. It is well recognized that computing remainders is even simpler because the quotient is not needed. In a simplified example, a sequence of six bit XORs can be performed with bit shifting after each XOR.

Many communications applications that use wide data paths to achieve high throughput use CRCs to detect corrupted packets. CRCs may be calculated in parallel. However, as the data path width increases, the word size or the number of bits to be processed in parallel increases. The size of the XOR operations increase and the speed of the circuit decreases.

Consequently, the techniques of the present invention have recognized through observations of particular characteristics of CRCs that the CRC of an entire message or full sequence can be calculated as a series of CRCs on smaller subsequences. The CRCs are performed on a subset of the message bits. The results of the CRCs on the subsequences involve smaller sequences and thus have smaller exclusive-OR (XOR) expressions and run more efficiently.

An input sequence data sequence is divided into subsequences. In one example, a 64-bit word size (d0, d1, d2, . . . d63) is assumed. The input data word is divided into multiple, e.g. 4 subwords w0, w1, w2, w3, where each sub-word gets every 4th bit. That is, w0={d0, d4, d8, . . . d60}, w1={d1, d5, d9, . . . d61} and so on. Each subword is fed into a separate CRC circuit. According to various embodiments, each CRC circuit can operate entirely independently from other CRC circuits. In conventional implementations, attempts to split a computation of a CRC into multiple circuits still treat a CRC as a single entity. Dependencies and relations between different XOR operations, for example, had to be tracked. In typical implementations, fewer XOR operations could sometimes be used if the number of layers was increased.

According to various embodiments of the present invention, both logic breadth and depth can be reduced. In some examples, each subword is passed to a separate CRC circuit. Each separate CRC circuit produces a sub-CRC. The sub-CRCs are then interleaved and a CRC calculation is performed at a CRC combiner over the result to obtain the final CRC for the input data sequence. No large CRC circuits are required. It should be noted that combining multiple sub-CRCs results in a large word size for the CRC combiner. However, the combiner operates on a sequence that is a fraction of the size of the input data sequence and is a feedforward circuit that may be arbitrarily pipelined for performance and sharing of subexpressions. It may also be combined with a circuit to compensate for partial words at the end of a packet.

A variety of mechanisms including parallel processing are available for improving CRC computation. Decomposition and simulated annealing are several mechanisms that can improve efficiency. For example, a wide XOR expression can be factored into smaller expressions. However, conventional mechanisms for factoring still treat an input data sequence as a single unit.

Figure 1:
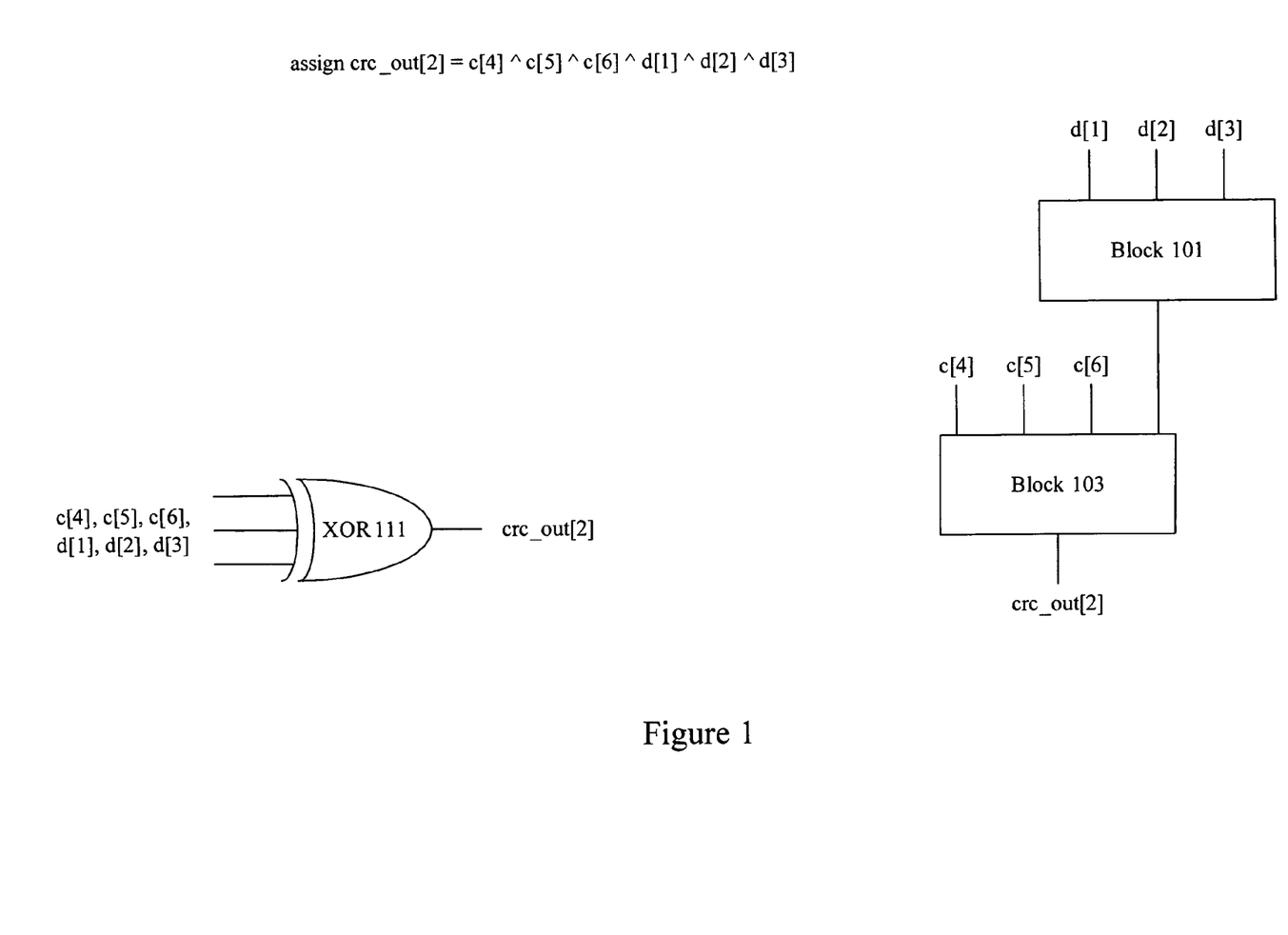
FIG. 1 is a diagrammatic representation showing a CRC calculation.

FIG. 1 is a diagrammatic representation showing an available technique for implementing CRC's using XOR gates. It is well known that remainder or CRC output bits can be determined by performing XOR operations on various polynomial and data bits. For example, where c[0]–c[7] represent an 8 bit polynomial and d[0]–d[3] represent 4 bits of data, the remainders can be expressed in the following manner:

crc_out[0]=c[4]^d[3];
crc_out[1]=c[4]^c[5]^d[2]^d[3];
crc_out[2]=c[4]^c[5]^c[6]^d[1]^d[2]^d[3];
crc_out[3]=c[5]^c[6]^c[7]^d[0]^d[1]^d[2];
crc_out[4]=c[0]^c[6]^c[7]^d[0]^d[1];
crc_out[5]=c[1]^c[7]^d[0];
crc_out[6]=c[2];
crc_out[7]=c[3];

Wide CRCs and the required wide XORs such as c[4]^c[5]^c[6]^d[1]^d[2]^d[3] can be implemented as large blocks or logic or can be decomposed or factored. An XOR function 111 is implemented using multiple blocks 101 and 103. According to various embodiments, three input block 101 takes inputs d[1], d[2], d[3] and provides an output to block 103. Four input block 103 takes inputs c[4], c[5], c[6], and the output of block 101 and provides crc_out[2]. In some implementations, a block is a lookup table (LUT). For example, a CRC32 with 32-bit data uses XORs with up to 34 inputs. A 128-bit data sequence uses an 89 input XOR.

Figure 2A:
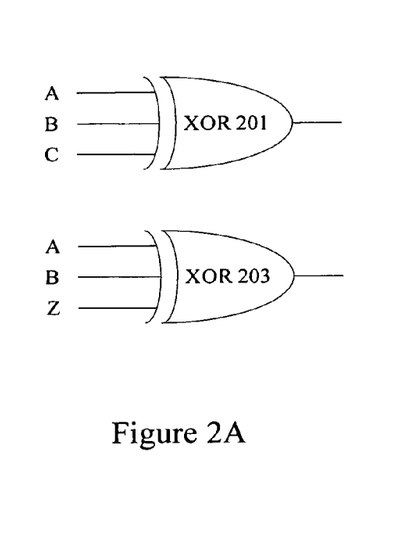
FIG. 2A-2C are diagrammatic representations showing XOR gates and decomposition.
Figure 2B:
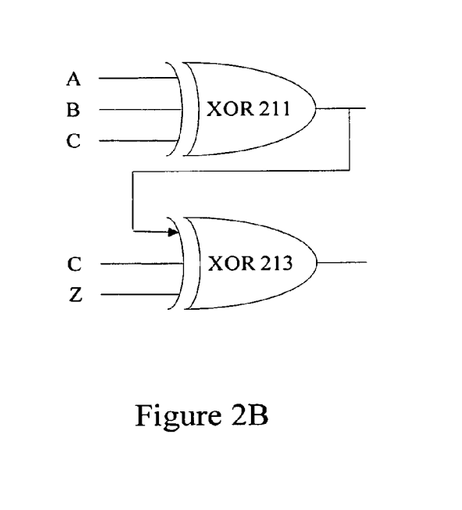
Figure 2C:
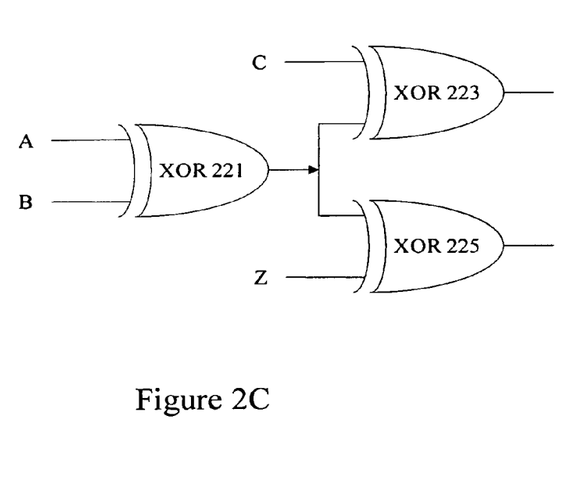

FIG. 2A-2C are diagrammatic representations showing an available mechanism for XOR decomposition. FIG. 2A shows XOR gate 201 with inputs A, B, and C and XOR gate 203 with inputs A, B, and Z. The XORs are in flat and unfactored form. FIG. 2B shows XOR gate 211 with inputs A, B and C and XOR gate 213 with inputs C, Z, and the output of XOR gate 211. The C signal in XOR gate 211 is canceled when XOR gate 213 takes the C signal again as an input. That is, A^B^C^C^Z is equivalent to A^B^Z. Cancellation increases the number of factoring and decomposition possibilities exponentially. Consequently, many conventional implementations do not use cancellation when factoring. FIG. 2C shows XOR gate 221 with inputs A and B. The output of XOR gate 221 is provided to XOR gate 223 and to XOR gate 225. XOR gate 223 takes as inputs C and the output of XOR gate 221. XOR gate 225 takes as inputs Z and the output of XOR gate 221.

Figure 3A:
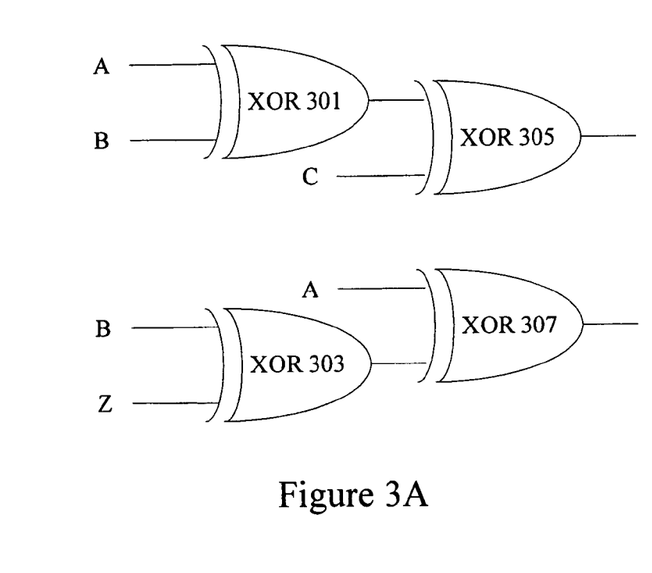
FIG. 3A-3B are diagrammatic representations showing XOR gates and decomposition.
Figure 3B:
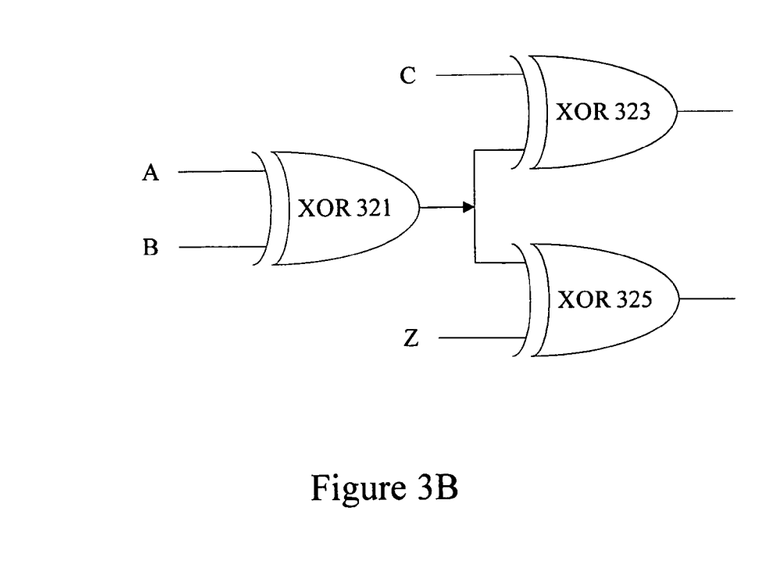

FIGS. 3A and 3B are diagrammatic representations showing factoring. According to various embodiments, it is important that the factoring algorithm make good reuse of extracted functions to minimize the amount of logic and the levels or logic required to implement a resulting CRC system. Minimizing the number of LUTs improves resource usage and minimizing the number of levels increases processing speed. In many conventional implementations, using more area on a device is required in order to increase CRC processing speed.

FIG. 3A shows XOR gate 301 with inputs A and B providing an output to XOR gate 305. XOR gate 305 takes as inputs C and the output of XOR gate 301. XOR gate 303 takes as inputs Z and B and provides an output to XOR gate 307. XOR gate 307 takes as inputs A and the output of XOR gate 301. Four XOR gates are used to implement a two level system. FIG. 3B shows XOR gate 321 with inputs A and B. The output of XOR gate 321 is provided to XOR gate 323 and to XOR gate 325. XOR gate 323 takes as inputs C and the output of XOR gate 321. XOR gate 325 takes as inputs Z and the output of XOR gate 321. The circuits shown in FIGS. 3A and 3B are equivalent, but the circuit shown in FIG. 3A uses 4 cells while the circuit shown in FIG. 3B uses only 3 cells.

Conventional algorithms do a poor job of factoring CRCs. Conventional algorithms are generally restricted to non-cancellation factoring because it is believed that the search space with cancellation is unmanageable. Attempts at performing cancellation factoring exhibit run time problems because the number of possible extractions increases exponentially with the size of the CRC. Some attempts have been made to do XOR cancellation factoring. However, XOR factoring remains suboptimal and inefficient.

Consequently, the techniques of the present invention recognize particular characteristics of Galois field operations used in CRC calculations. According to various embodiments, the following polynomial is assumed in prime field of order 2 [GF(2]:

$$P = A_{n-1}X^{n-1} + A_{n-2}X^{n-2} + A_{n-3}X^{n-2} + \ldots A_1 X + A_0$$

where $A_i$ is taken from the set [0,1].
The square of the polynomial is the following:

$$P^2 = A_{n-1}2X^{2n-2} + 2A_{n-1}A_{n-2}X^{2n-3} + 2A_{n-1}A_{n-3}X^{2n-4} + \ldots +$$

$$A_{n-2}2X^{2n-4} + 2A_{n-2}A_{n-3}X^{2n-5} + 2A_{n-1}A_{n-4}X^{2n-5} + \ldots +$$

$$2A_{n-1}A_{n-5}X^{2n-6} + 2A_{n-2}A_{n-4}X^{2n-6} + A_{n-3}2X^{2n-6} \ldots +$$

$$+2A_{n-1}A_{n-6}X^{2n-7} + 2A_{n-2}A_{n-5}X^{2n-7} + 2A_{n-3}A_{n-4}X^{2n-7} + \ldots +$$

$$2A_{n-3}A_{n-5}X^{2n-8} + \ldots + A_{n-4}2X^{2n-8} + \ldots + A_2^2 X^4 + 2A_2 A_1 X^3 +$$

$$A_2 A_0 X^2 + A_1^2 X^2 + 2A_1 A_0 X + A_0^2$$

The techniques of the present invention recognize that the coefficients are elements of GF(2), i.e. they are taken from the set [0,1] and modulo(2) is added. Consequently, the coefficients have the following properties.

$$A_m^2 = A_m$$

and $$2A_m = 0$$

The square of the polynomial consequently reduces to the following:

$$P^2 = A_{n-1}2X^{2n-2} + A_{n-2}2X^{2n-4} + A_{n-3}2X^{2n-6} + \ldots +$$

$$+ A_2 X^4 + A_1 X^2 + A_0$$

If a binary word is used to represent the polynomial P and P includes bits $\{P_{n-1}, P_{n-2}, P_{n-3}, \ldots, P_2, P_1, P_0\}$, $P^2$ is $\{P_{n-1}, 0, P_{n-2}, 0, P_{n-3}, 0, \ldots, 0, P_2, 0, P_1, 0, P_0\}$. In other words, $P^2$ is created by inserting a zero between each bit of P. According to various embodiments, a generator polynomial G is used to calculate a CRC. Dividing a polynomial P by G leaves a remainder R. Therefore, P=kG+r, where k is a polynomial that does not need to be considered here. Consequently, the polynomial P squared is the following:

$$P^2 = (kG + R)^2 = k^2 G^2 + 2kGR + R^2$$

The remainder of $P^2$ with respect to G is the remainder of R with respect to G, since k divides $k^2 G^2 + 2kGR$. $R^2$ can be calculated from R by inserting zeros as noted above. In one example, a polynomial P is set as the following because the coefficients of the odd power terms are zero:

$$P = A_{n-1}X^{n-1} + A_{n-3}X^{n-3} + A_{n-5}X^{n-5} + \ldots + A_2 X^2 + A_0$$

The polynomial P can be represented by the following binary pattern:

$$\{P_{n-1}, 0, P_{n-2}, 0, P_{n-3}, 0, \ldots, 0, P_2, 0, P_1, 0, P_0\}$$

In order to determine the remainder R modulo G, the following binary pattern can be divided by G to get $R_c$. The remainder is then squared to get $R_c^2$ and the result is divided.

In terms of CRC calculations, this means that a message sequence can be divided by calculating separate CRCs over the even bits and the odd bits, and bit interleaving the resulting sub-CRCs and performing a final remainder. This analysis may be applied recursively to handle 4-way interleaving, 8-way, or any $2^n$-way interleaving.

Figure 4:
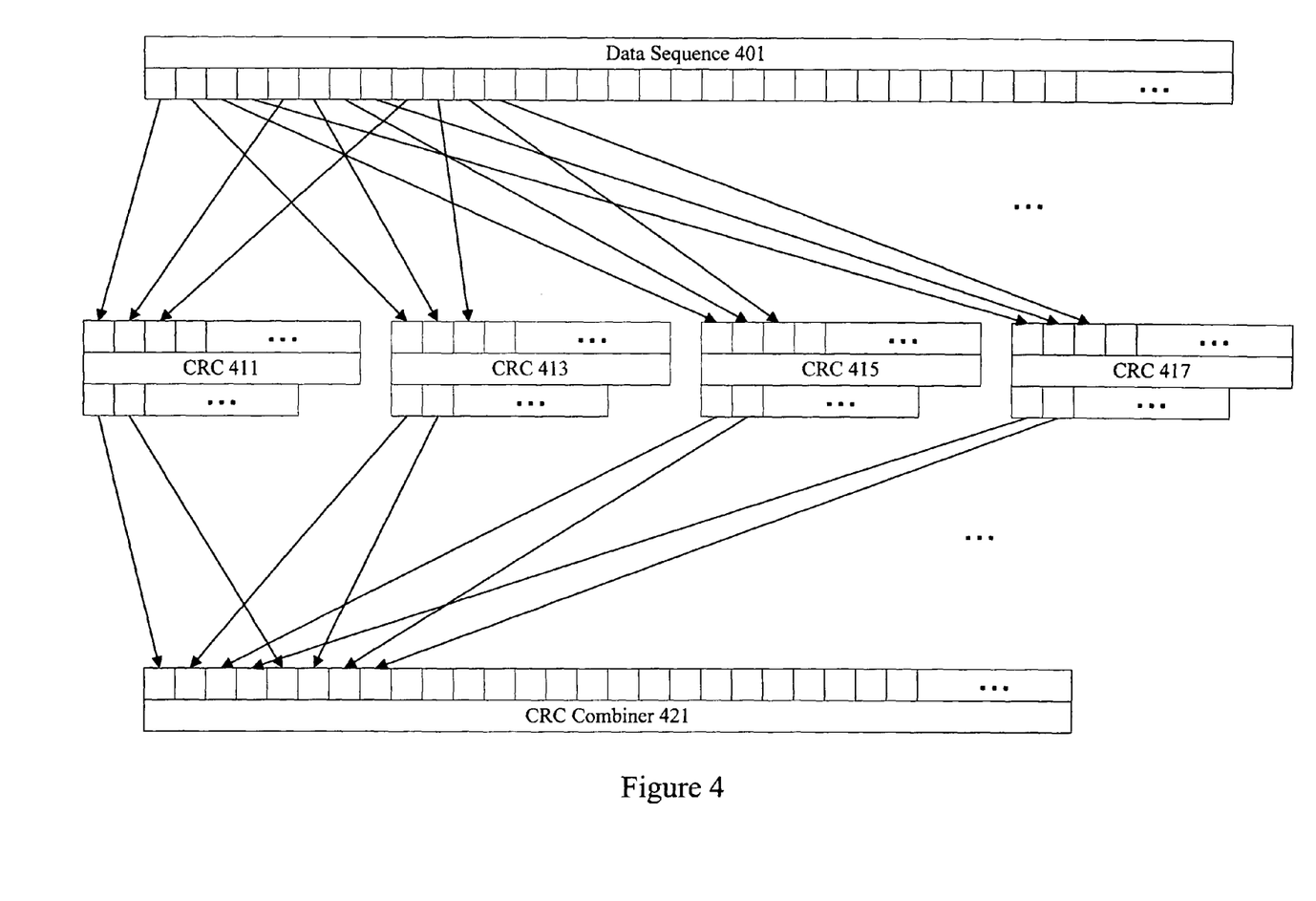
FIG. 4 is a diagrammatic representation showing calculation of CRC using CRC subsequences.

FIG. 4 is a diagrammatic representation showing an example of calculation of a full CRC using sub-CRCs. A data sequence 401 is provided as input. The data sequence 401 may be data used in an application such as Ethernet, Hypertransport, RapidIO, SerialLite, Generic Framing protocol, etc. Any application that uses error detection codes such as CRCs to detect errors in transmission or processing may provide a data sequence 401. In one embodiment, the data sequence is a data word. In another example, a 32 byte sequence is provided as input data. CRC circuitry configured to operate on a 32 byte sequence would use a substantial amount of resources. The data sequence is divided into multiple subsequences.

According to various embodiments, the data sequence is divided into any $2^n$ number of blocks where each block gets every Nth bit. For example, a 64-bit word (d0, d1, d2, ..., d63) would be split into {d0, d4, d8, ..., d60}, {d1, d5, d9, ..., d61}, {d2, d6, d10, ..., d62}, and {d3, d7, d11, ..., d63}. In another embodiment, a 32 byte sequence is divided into four 8 byte sequences for processing by CRC blocks 411, 413, 415, and 417. Each CRC block 411, 413, 415, and 417 may include shift registers and XOR gates. Each block 411, 413, 415, and 417 produces a sub-CRC. In one embodiment, each sub-CRC is two bytes. The sub-CRCs are then interleaved to produce an 8 byte sequence and provided to a CRC combiner to perform a full CRC on the interleaved 8 byte sequence 421. CRC circuitry configured to operate on 8 byte sequences is much less resource intensitve that CRC circuitry configured to operate on a 32 byte sequence.

One example calculation is shown as follows:
Generator: 1 1021 (CRC-CCITT)
Full data word:
eccb 8ceb 4436 a33e 18a4 e04b cb9d 28fa
adba 7881 55f3 a865 5868 d61b b09a 5fdd
CRC over full data word: 14d0
subword[0]: 1126 8172 69f1 8baf
Sub-CRC: 42d2
subword[1]: 933f294b b83a 2594
Sub-CRC: 651f
subword[2]: e6d1 1a92 48e3 ac0f
Sub-CRC: 1b18
subword[3]: ff09 69f7 f62c 59b7
Sub-CRC: 359a
Bit-interleaved sub-CRCs: 03ac 4a5e 910f e2b2
CRC over interleaved sub-CRCs: 14d0 (same as CRC over full word)

The techniques and mechanisms of the present invention can be implemented on a variety of devices. Devices such as Application Specific Integrated Circuits (ASICs) and Field Programmable Gate Arrays (FPGAs) that implement CRC operations using logic or circuitry can benefit. However, the techniques of the present invention are particularly beneficial on programmable chips, as XOR gates are relatively expensive on programmable devices.

Figure 5:
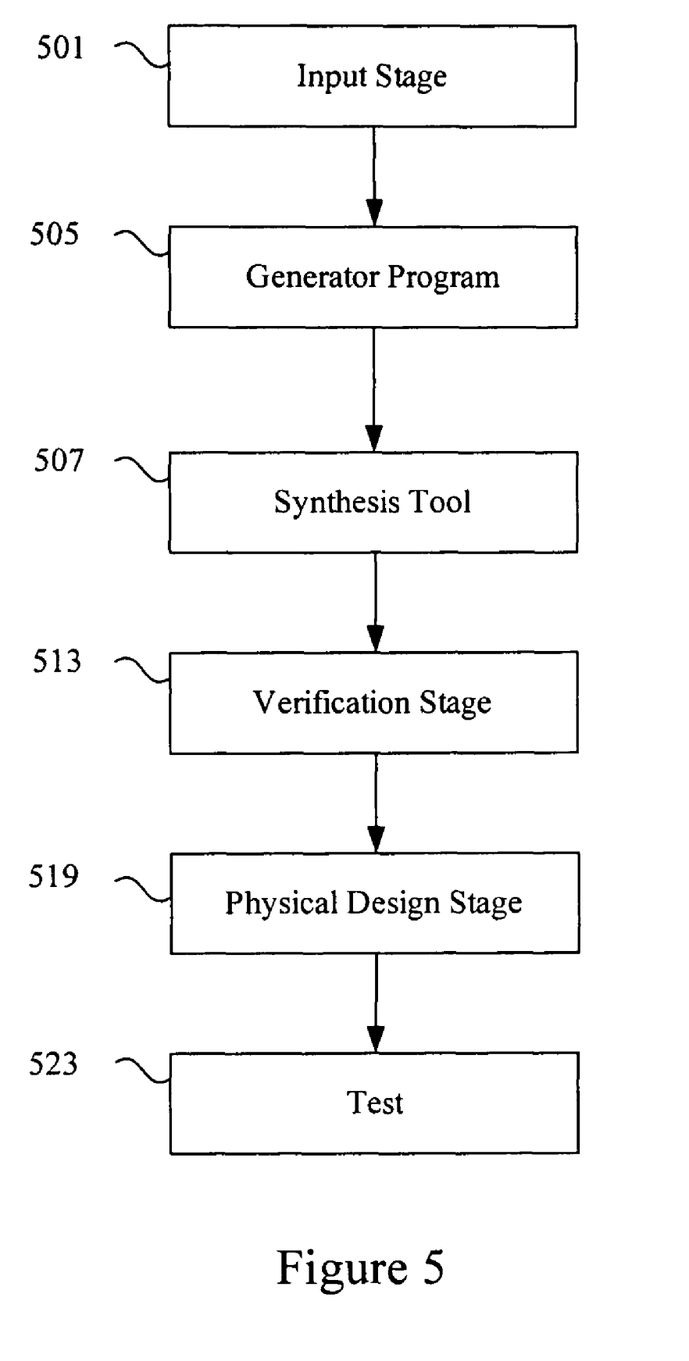
FIG. 5 is a diagrammatic representation showing a technique for implementing the programmable chip.

FIG. 5 is a diagrammatic representation showing implementation of a programmable chip. According to various embodiments, an input stage 501 receives selection information typically from a user for logic to be implemented on an electronic device. A generator program 505 creates a logic description and provides the logic description along with other customized logic to any of a variety of synthesis tools, place and route programs, and logic configuration tools to allow a logic description to be implemented on an electronic device.

The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected.

In typical implementations, the generator program 505 can identify the selections and generate a logic description with information for implementing the various modules. The generator program 505 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 505 identifies pointers and provides ports for each pointer. The generator program 505 also provides information to a synthesis tool 507 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 509.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 513 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 513, the synthesized netlist file can be provided to physical design tools 519 including place and route and configuration tools. A place and route tool typically locates logic cells on specific logic elements of a target hardware device and connects wires between the inputs and outputs of the various logic elements in accordance with logic required to implement an electronic design. The device can also be physically tested at 523.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 501, the generator program 505, the synthesis tool 507, the verification tools 513, and physical design tools 519 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
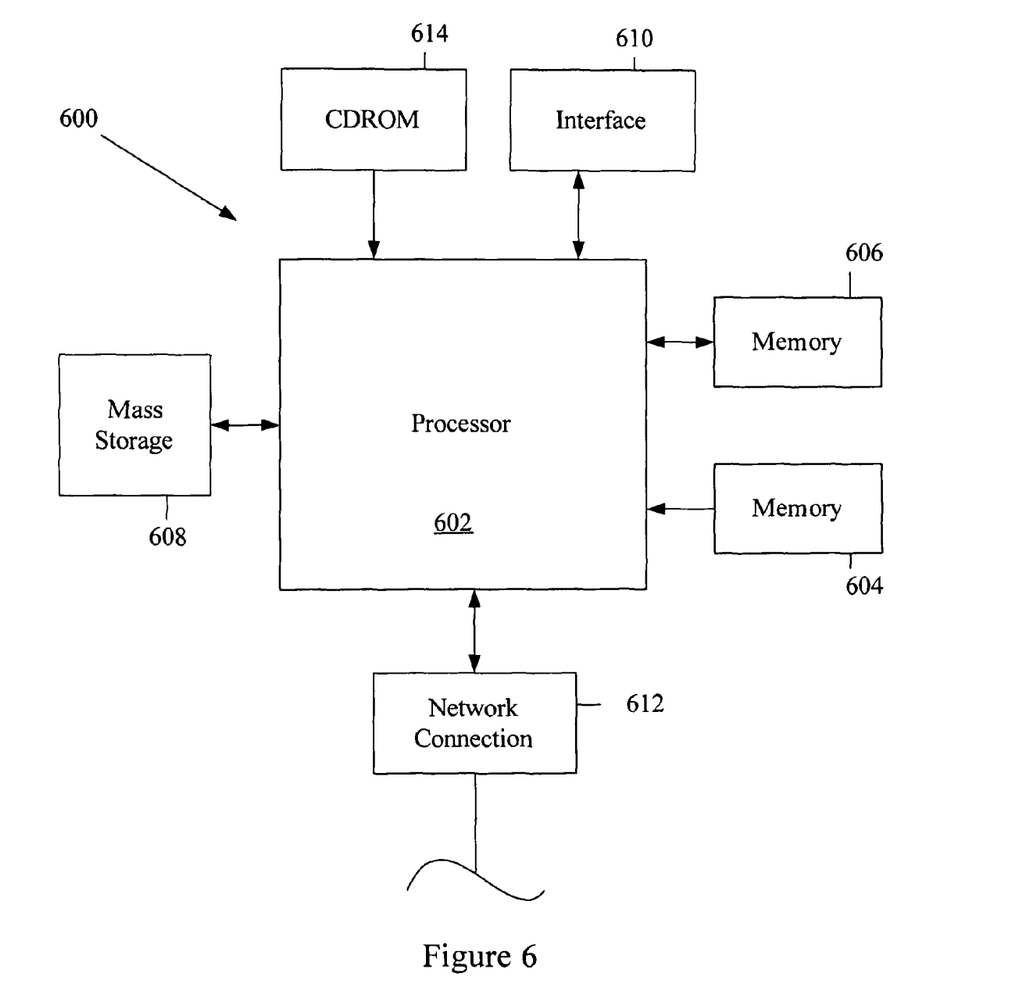
FIG. 6 is a diagrammatic representation depicting a computer system.

FIG. 6 illustrates a typical computer system that can be used to implement a programmable chip having shared I/O lines. The computer system 600 includes any number of processors 602 (also referred to as central processing units, or CPUs) that are coupled to devices including memory 606

(typically a random access memory, or "RAM"), memory 604 (typically a read only memory, or "ROM"). The processors 602 can be configured to generate a test sequences for any designated processor. As is well known in the art, memory 604 acts to transfer data and instructions uni-directionally to the CPU and memory 606 is used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as a CD-ROM 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 602 optionally may be coupled to a computer or telecommunications network using a network connection as shown generally at 612. With such a network connection, it is contemplated that the CPU might receive information from the network, or might output information to the network in the course of performing the above-described method steps. It should be noted that the system 600 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 608 or 614 and executed on CPU 608 in conjunction with primary memory 606.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. It is therefore intended that the invention be interpreted to include all variations and equivalents that fall within the true spirit and scope of the present invention.

What is claimed is:

1. A method for computation of a cyclic redundancy check (CRC) using CRC circuitry, the method comprising:
    receiving a data sequence P having a length of N bits at a data input sequence block;
    splitting the data sequence P into M subsequences;
    providing the M subsequences to a plurality of separate CRC circuits, wherein the plurality of separate CRC circuits generate a plurality of sub-CRCs;
    bit interleaving the plurality of sub-CRCs to provide a bit-interleaved sub-CRC by using a bit interleaver;
    performing a CRC calculation over the bit-interleaved sub-CRC at CRC combiner circuitry, wherein CRC combiner circuitry provides the CRC of the data sequence P.

2. The method of claim 1, wherein the plurality of sub-CRCs and the CRC of the data sequence P is calculated using a generator polynomial G.

3. The method of claim 1, wherein performing a CRC calculation comprises dividing P by G to determine a remainder R.

4. The method of claim 1, wherein $P=A_{n-1}X^{n-1}+A_{n-2}X^{n-2}+A_{n-3}X^{n-2}+\ldots A_1X+A_0$, where $A_i$ is taken from the set $[0,1]$.

5. The method of claim 1, wherein $P^2=A_{n-1}2X^{2n-2}+2A_{n-2}X^{2n-3}+2A_{n-1}A_{n-3}X^{2n-4}+\ldots+A_{n-2}2X^{2n-4}+2A_{n-2}A_{n-3}X^{2n-5}+2A_{n-1}A_{n-4}X^{2n-5}+\ldots+2A_{n-1}A_{n-5}X^{2n-6}+2A_{n-2}A_{n-4}X^{2n-6}+A_{n-3}2X^{2n-6}+\ldots+2A_{n-1}A_{n-6}X^{2n-7}+2A_{n-2}A_{n-5}X^{2n-7}+2A_{n-2}A_{n-5}X^{2n-7}+2A_{n-3}A_{n-4}X^{2n-7}+\ldots+2A_{n-3}A_{n-5}X^{2n-8}+\ldots+A_{n-4}2X^{2n-8}+\ldots+A_2^2X^4+2A_2A_1X^3+A_2A_0X^2+A_1^2X^2+2A_1A_0X+A_0^2$.

6. The method of claim 1, wherein $P^2=A_{n-1}2X^{2n-2}+A_{n-2}2X^{2n-4}+A_{n-3}2X^{2n-6}+\ldots+A_2X^4+A_1X^2+A_0$, since $A_i2=A_i$ and $2A_i=0$.

7. The method of claim 1, wherein each of the M subsequences gets every Mth bit of the data sequence P.

8. The method of claim 7, wherein the data sequence is split into four subsequences (subseq0, subseq1, subseq2, and subseq3).

9. The method of claim 7, wherein subseq0={d0, d4, d8, . . . }, subseq1={d1, d5, d9, . . . }, subseq2={d2, d6, d10, . . . }, subseq3={d3, d7, d11, . . . }, where d0 is data sequence bit 0, d1 is data sequence bit 1, d2 is data sequence bit 2, etc.

10. The method of claim 7, further comprising performing decomposition.

11. A device for computation of a cyclic redundancy check (CRC), the device comprising: a data input sequence block configured to receive a data sequence P having a length of N bits;
    a plurality of CRC circuits, wherein the plurality of CRC circuits are configured to process M subsequences split from the data sequence P to generate a plurality of sub-CRCs;
    a bit interleaver configured to combine the plurality of sub-CRCs to provide a bit-interleaved sub-CRC;
    a CRC combiner configured to performing a CRC calculation over the bit-interleaved sub-CRC, wherein CRC combiner provides the CRC of the data sequence P.

12. The device of claim 11, wherein the plurality of sub-CRCs and the CRC of the data sequence P is calculated using a generator polynomial G.

13. The device of claim 11, wherein performing a CRC calculation comprises dividing P by G to determine a remainder R.

14. The device of claim 11, wherein $P=A_{n-1}X^{n-1}+A_{n-2}X^{n-2}+A_{n-3}X^{n-2}+\ldots A_1X+A_0$, where $A_i$ is taken from the set $[0,1]$.

15. The device of claim 11, wherein $P^2 = A_{n-1}2X^{2n-2} + 2A_{n-1}A_{n-2}X^{2n-3} + 2A_{n-1}A_{n-3}X^{2n-4} + \ldots + A_{n-2}2X^{2n-4} + 2A_{n-2}A_{n-3}X^{2n-5} + 2A_{n-1}A_{n-4}X^{2n-5} + \ldots + 2A_{n-1}A_{n-5}X^{2n-6} + 2A_{n-2}A_{n-4}X^{2n-6} + A_{n-3}2X^{2n-6} + \ldots + 2A_{n-1}A_{n-6}X^{2n-7} + 2A_{n-2}A_{n-5}X^{2n-7} + 2A_{n-3}A_{n-4}X^{2n-7} + \ldots + 2A_{n-3}A_{n-5}X^{2n-8} + \ldots + A_{n-4}2X^{2n-8} + \ldots + A_2^2X^4 + 2A_2A_1X^3 + A_2A_0X^2 + A_1^2X^2 + 2A_1A_0X + A_0^2$.

16. The device of claim 11, wherein $P^2 = A_{n-1}2X^{2n-2} + A_{n-2}2X^{2n-4} + A_{n-3}2X^{2n-6} + \ldots + A_2X^4 + A_1X^2 + A_0$, since $A_i$ and $2A_i = 0$.

17. The device of claim 11, wherein each of the M subsequences gets every Mth bit of the data sequence P.

18. The device of claim 17, wherein the data sequence is split into four subsequences (subseq0, subseq1, subseq2, and subseq3).

19. The device of claim 17, wherein subseq0={d0, d4, d8, ...}, subseq1={d1, d5, d9, ...}, subseq2={d2, d6, d10, ...}, subseq3={d3, d7, d11, ...}, where d0 is data sequence bit 0, d1 is data sequence bit 1, d2 is data sequence bit 2, etc.

20. An apparatus for computing a cyclic redundancy check (CRC), the apparatus comprising:
   means for receiving a data sequence P having a length of N bits;
   means for splitting the data sequence P into M subsequences;
   means for providing the M subsequences to a plurality of separate CRC circuits, wherein the plurality of separate CRC circuits generate a plurality of sub-CRCs;
   means for bit interleaving the plurality of sub-CRCs to provide a bit-interleaved sub-CRC;
   means for performing a CRC calculation over the bit-interleaved sub-CRC at CRC combiner circuitry, wherein CRC combiner circuitry provides the CRC of the data sequence P.

21. The apparatus of claim 20, wherein the plurality of sub-CRCs and the CRC of the data sequence P is calculated using a generator polynomial G.

22. The apparatus of claim 20, wherein performing a CRC calculation comprises dividing P by G to determine a remainder R.

23. The apparatus of claim 20, wherein $P = A_{n-1}X^{n-1} + A_{n-2}X^{n-2} + A_{n-3}X^{n-2} + \ldots A_1X + A_0$, where $A_i$ is taken from the set [0,1].

24. The apparatus of claim 20, wherein $P^2 = A_{n-1}2X^{2n-2} + 2A_{n-1}A_{n-2}X^{2n-3} + 2A_{n-1}A_{n-3}X^{2n-4} + \ldots + A_{n-2}2X^{2n-4} + 2A_{n-2}A_{n-3}X^{2n-5} + 2A_{n-1}A_{n-4}X^{2n-5} + \ldots + 2A_{n-1}A_{n-5}X^{2n-6} + 2A_{n-2}A_{n-4}X^{2n-6} + A_{n-3}2X^{2n-6} + \ldots + 2A_{n-1}A_{n-6}X^{2n-7} + 2A_{n-2}A_{n-5}X^{2n-7} + 2A_{n-3}A_{n-4}X^{2n-7} + \ldots + 2A_{n-3}A_{n-5}X^{2n-8} + \ldots + A_{n-4}2X^{2n-8} + \ldots + A_2^2X^4 + 2A_2A_1X^3 + A_2A_0X^2 + A_1^2X^2 + 2A_1A_0X + A_0^2$.

25. The apparatus of claim 20, wherein $P^2 = A_{n-1}2X^{2n-2} + A_{n-2}2X^{2n-4} + A_{n-3}2X^{2n-6} + \ldots + A_2X^4 + A_1X^2 + A_0$, since $A_i2 = A_i$ and $2A_i = 0$.

* * * * *